United States Patent
Ootsuka et al.

(10) Patent No.: US 6,872,908 B2
(45) Date of Patent: Mar. 29, 2005

(54) SUSCEPTOR WITH BUILT-IN ELECTRODE AND MANUFACTURING METHOD THEREFOR

(75) Inventors: Takeshi Ootsuka, Funabashi (JP); Kazunori Endou, Funabashi (JP); Mamoru Kosakai, Narashino (JP)

(73) Assignee: Sumitomo Osaka Cement Co., Ltd. (JP)

( * ) Notice: Subject to any disclaimer, the term of this patent is extended or adjusted under 35 U.S.C. 154(b) by 0 days.

(21) Appl. No.: 10/270,886

(22) Filed: Oct. 11, 2002

(65) Prior Publication Data
US 2003/0071260 A1 Apr. 17, 2003

(30) Foreign Application Priority Data
Oct. 17, 2001 (JP) .................................... P2001-319693

(51) Int. Cl.⁷ ............................................... B23K 9/00
(52) U.S. Cl. .................... 219/121.52; 219/390
(58) Field of Search ........................ 219/390, 405, 219/411, 121.58, 121.59, 121.43, 121.52, 121.41, 121.4, 444.1; 393/416, 418; 118/728, 724, 725; 204/269

(56) References Cited

U.S. PATENT DOCUMENTS 6,113,704 A * 9/2000 Satoh et al. ............ 118/728

6,441,548 B1 * 8/2002 Arimoto ..................... 313/491

FOREIGN PATENT DOCUMENTS

| JP | 01-138174 | 5/1989 |
| JP | 2001-085505 | 3/2001 |
| JP | 2001-308165 | 11/2001 |

* cited by examiner

Primary Examiner—Douglas Wille
Assistant Examiner—Dana Farahani
(74) Attorney, Agent, or Firm—Ostrolenk, Faber, Gerb & Soffen, LLP

(57) ABSTRACT

There is provided a susceptor with a built-in electrode and a manufacturing method therefor, in which there is no danger of corrosive gas or plasma or the like penetrating to the inside of the substrate, which has excellent corrosion resistance and plasma resistance, in which nonconductivity under high temperatures is improved, and in which leakage current does not occur. A susceptor with a built-in electrode 21 according to the present invention comprises: a mounting plate 22 and a support plate 23 which are formed from aluminum nitride based sintered bodies; an internal electrode 24 formed from either an aluminum nitride and tungsten composite sintered body or an aluminum nitride and molybdenum composite sintered body, which is formed between the mounting plate 22 and the support plate 23; and power supply terminals 26 which are provided in the support plate 23 and are electrically connected to the internal electrode 24, and both surfaces of the internal electrode 24 are coated with a nonconductive material 30 comprising AlN particles.

3 Claims, 4 Drawing Sheets

SUSCEPTOR WITH BUILT-IN ELECTRODE AND MANUFACTURING METHOD THEREFOR

BACKGROUND OF THE INVENTION

1. Field of the Invention

The present invention relates to a susceptor with a built-in electrode and a manufacturing method therefor, and relates specifically to a susceptor with a built-in electrode which has high corrosion resistance and plasma resistance, and in which leakage current can be prevented, and a manufacturing method for a susceptor with a built-in electrode whereby a susceptor with a built-in electrode can be manufactured economically, with a high yield rate.

2. Description of the Related Art

Recently, beginning with manufacturing methods for semiconductor devices such as IC, LSI and VLSI, a move towards single substrate processing is proceeding in the manufacturing method for display devices such as liquid crystal displays (LCD) and plasma displays (PDP), and in the assembly process for hybrid ICs, in which plate specimens such as semiconductor wafers, liquid crystal glass substrates, printed circuits, etc. are processed individually, so that an etching process or a deposition process can be performed evenly on each individual wafer or substrate.

In this single substrate processing, in order to keep the plate specimens separate in the processing room, the plate specimens are mounted on a stage (seat) called a susceptor, and the prescribed processing is performed.

Because this susceptor must withstand use within plasma and use at high temperatures, the susceptor must have excellent plasma resistance and high heat conductivity.

For such a susceptor, a susceptor formed from an aluminum nitride based sintered body, which has excellent plasma resistance and heat conductivity is used.

One class of such a susceptor is a susceptor with a built-in electrode, in which an internal electrode such as; an electrostatic chuck electrode which generates an electric charge and secures the plate specimen by electrostatic attraction, a heater electrode which heats the plate specimen by current heating, a plasma generation electrode for performing plasma processing by conducting high frequency power to generate plasma, or the like, is provided inside of the susceptor substrate which has a mounting surface for mounting the plate specimen.

FIG. 5 is a cross-sectional view showing an example of a conventional susceptor with a built-in electrode formed from an aluminum nitride based sintered body. This susceptor 1 comprises; a mounting plate 2 for mounting the plate specimen, a support plate 3 which supports this mounting plate 2, an internal electrode 4 which joins and integrates the mounting plate 2 and the support plate 3 and which is formed from a conductive binder layer, and power supply terminals 5 which are embedded in the support plate 3 so as to contact this internal electrode 4, and which supply electrical current into the internal electrode 4.

The mounting plate 2 comprises a plate shaped body formed from a nonconductive and dielectric aluminum nitride sintered body, the support plate 3 comprises a plate shaped body formed from a nonconductive aluminum nitride based sintered body, and the conductive binder layer which forms the internal electrode 4 is made from either an organic compound or a metal.

This susceptor with a built-in electrode 1 has a problem in that, as described above, since the mounting plate 2 and the support plate 3 are joined by a conductive binder layer made from a different material, that is by the internal electrode 4, the join between the mounting plate 2 and the support plate 3 can easily become inadequate, so that there is a possibility of the internal electrode 4 being exposed to gas or plasma if the interface is penetrated by corrosive gas or plasma, or that the joint interface of the mounting plate 2 and the support plate 3 may be damaged, and hence the corrosion resistance and plasma resistance is insufficient for use as a susceptor.

In this conventional susceptor with a built-in electrode 1, it is necessary to prevent the penetration of gas and plasma into the joint by ensuring a sound join between the mounting plate 2 and the support plate 3.

FIG. 6 is an exploded cross-sectional view showing each structural element of an improved susceptor with a built-in electrode 11 which improves on these points, and FIG. 7 is a cross-sectional view showing the entire form of this improved susceptor with a built-in electrode 11. The construction is such that a ring shaped flange 12a is provided around the peripheral edge of the lower surface of the mounting plate 12 which is formed from an aluminum nitride based sintered body, and a circular depression 12b is thus formed in the bottom surface of the mounting plate 12.

Then, by integrating into this depression 12b an internal electrode 13 formed from a conductive binder layer, and a support plate 15 which is formed from an aluminum nitride based sintered body into which a power supply terminal 14 is embedded, the improved susceptor with a built-in electrode 11 is obtained.

However, the susceptor with a built-in electrode 11 as described above has a problem in that the mounting plate 12 must be processed so as to have the shape described above, and the internal electrode 13 and the support plate 15 must be designed to fit within the depression 12b in the mounting plate 12 without any gaps. Consequently the manufacturing method for this susceptor with a built-in electrode 11 is complex, and the manufacturing costs are high.

Furthermore, these susceptors with built-in electrodes 1 and 11 have in common a problem in that the nonconductivity thereof reduces under high temperatures, for example, the volume resistivity value under a temperature of 300° C. is approximately $10^6 \Omega/cm$, and leakage current occurs.

SUMMARY OF THE INVENTION

In view of the above circumstances, an object of the present invention is to provide a susceptor with a built-in electrode, wherein penetration of corrosive gas or plasma into the susceptor substrate which is formed from an aluminum nitride based sintered body does not occur, resulting in excellent corrosion resistance and plasma resistance and improved nonconductivity under high temperatures, and wherein leakage current does not occur, and to further provide a manufacturing method which allows a susceptor with a built-in electrode to be obtained easily, economically, and with a high yield rate.

As a result of intensive research, the inventors discovered that, in a susceptor with a built-in electrode comprising a susceptor substrate formed from an aluminum nitride based sintered body and an internal electrode formed from an aluminum nitride and tungsten composite sintered body or an aluminum nitride and molybdenum composite sintered body which is built into this susceptor substrate, by performing special heat treatment or a reduction process on the aluminum nitride based sintered body and the aluminum nitride and tungsten composite sintered body or aluminum nitride and molybdenum composite sintered body, or on the aluminum nitride powder and the aluminum nitride and tungsten composite material or aluminum nitride and molybdenum composite material, which form this susceptor, leakage current does not occur, and the joint of the aluminum nitride sintered bodies is tight and the possibility of corrosive gas or plasma penetrating the join is thus eliminated, thereby arriving at the invention in this application.

In other words, the susceptor with a built-in electrode according to a first aspect of the present invention comprises: a susceptor substrate formed from an aluminum nitride based sintered body which has one principal plane on which a plate specimen is mounted; an internal electrode which is formed from an aluminum nitride and tungsten composite sintered body or an aluminum nitride and molybdenum composite sintered body and is built into this susceptor substrate; and a power supply terminal which is provided on the susceptor substrate and supplies power to the internal electrode, and the internal electrode is coated with a nonconductive material.

Preferably the nonconductive material comprises an aluminum nitride sintered body.

The structure of this susceptor with a built-in electrode is such that the internal electrode formed from the aluminum nitride and tungsten composite sintered body or the aluminum nitride and molybdenum composite sintered body is built in to the susceptor substrate, and consequently there is no danger of this internal electrode being exposed to corrosive gas or plasma, resulting in excellent corrosion resistance and plasma resistance. Furthermore, because the internal electrode is coated with a nonconductive material, leakage current under high temperatures also does not occur.

The structure of the susceptor substrate may be such that the susceptor substrate comprises: a mounting plate formed from an aluminum nitride based sintered body which has a principal plane on which a plate specimen is mounted, and a support plate formed from an aluminum nitride based sintered body which supports the mounting plate, and the internal electrode is interposed between and joined and integrated by the mounting plate and the support plate.

In this susceptor with a built-in electrode, there is no danger of corrosive gas or plasma penetrating from the joining face of the mounting plate and the support plate, and consequently the joint interface of these plates cannot be damaged.

The manufacturing method for a susceptor with a built-in electrode according to a fourth aspect comprises the steps of: manufacturing a mounting plate on which a plate specimen is mounted and a support plate which supports the mounting plate, from aluminum nitride based sintered bodies; then forming a layer of conductive material containing an aluminum nitride and tungsten composite material or an aluminum nitride and molybdenum composite material on the support plate; then superposing the support plate and the mounting plate via the layer of conductive material, and heat treating the resulting product at a temperature of 1600° C. or higher; and subsequently slow cooling from the heat treating temperature to a temperature of 1500° C. or lower at a cooling rate of less than 5° C. per minute, or maintaining at a temperature of 1500° C. to 1800° C., to thereby form an internal electrode which is obtained by calcination of the layer of conductive material between the mounting plate and the support plate, and join and integrate these.

In this manufacturing method for a susceptor with a built-in electrode, because the mounting plate and the support plate which are made sintered bodies are joined and integrated, and heat treated, it is possible to easily obtain a susceptor with a built-in electrode which has excellent corrosion resistance and plasma resistance, and in which leakage current does not occur under high temperatures.

Furthermore, because the mounting plate and the support plate can be a simple plate shape, the use of complex shapes for these plates is not required, and the susceptor with a built-in electrode can be manufactured economically, and with a high yield rate.

Moreover, the susceptor with a built-in electrode is manufactured using the mounting plate and the support plate which are already in the form of a sintered body, and consequently it is possible to easily manufacture a susceptor with a built-in electrode which has high dimensional accuracy.

In addition, if a structure is employed in which a fastening hole is formed in the support plate, a power supply terminal is fitted into this fastening hole, and an internal electrode is formed on and wired to an upper surface of an edge of this power supply terminal, the power supply terminal and the internal electrode contact well, and a reliable electrical connection can thus be established.

The manufacturing method for a susceptor with a built-in electrode according to a fifth aspect comprises the steps of: manufacturing a mounting plate green body on which a plate specimen is mounted and a support plate green body which supports the mounting plate, from a slurry containing an aluminum nitride base powder; then forming a layer of a conductive material containing an aluminum nitride and tungsten composite material or an aluminum nitride and molybdenum composite material on the support plate green body; then superposing the support plate green body and the mounting plate green body via the layer of conductive material, and calcining the resulting product at a temperature of 1600° C. or higher; and subsequently slow cooling to a temperature of 1500° C. or lower at a cooling rate of less than 5° C. per minute, or maintaining at a temperature of 1500° C. to 1800° C., to thereby form an internal electrode which is obtained by calcination of the layer of conductive material between the mounting plate and the support plate, and join and integrate these.

In this manufacturing method for a susceptor with a built-in electrode, because the mounting plate green body and the support plate green body are calcined and joined and integrated, and heat treated, it is possible to easily obtain a susceptor with a built-in electrode which has excellent corrosion resistance and plasma resistance, and in which leakage current does not occur under high temperatures.

Furthermore, because the mounting plate and the support plate can be a simple plate shape, the use of complex shapes for these plates is not required, and the susceptor with a built-in electrode can be manufactured economically, and with a high yield rate.

Moreover, because the susceptor with a built-in electrode can be manufactured in one heat treatment (calcination) cycle, manufacturing costs can be reduced.

In addition, if a structure is employed in which a fastening hole is formed in the support plate green body, a power supply terminal is fitted into this fastening hole, and a conductive material layer constituting the internal electrode is formed on an the upper surface of an edge of this power supply terminal, the power supply terminal and the internal electrode contact well, and a reliable electrical connection can thus be established.

Furthermore, in the manufacturing method for a susceptor with a built-in electrode according to the fourth or fifth aspects, an insulation layer may be formed from a material which shares at least the same main component as the materials used to form the mounting plate and the support plate, in those regions on the support plate excluding the conductive material layer.

By employing such a structure, the join of the mounting plate and the support plate is further strengthened, and corrosion resistance and plasma resistance are also improved.

The manufacturing method for a susceptor with a built-in electrode according to a seventh aspect comprises the steps of: manufacturing a mounting plate on which a plate specimen is mounted and a support plate which supports the mounting plate, from aluminum nitride based sintered bodies; then forming a layer of conductive material containing an aluminum nitride and tungsten composite material or an aluminum nitride and molybdenum composite material on the support plate; then superposing the support plate and the mounting plate via the layer of conductive material, and heat treating the resulting product under a reducing atmosphere at 1600° C. or higher; and forming an internal electrode which is obtained by calcination of the layer of conductive material between the mounting plate and the support plate, and joining and integrating these.

In this manufacturing method for a susceptor with a built-in electrode, because the mounting plate and the support plate which are formed from sintered bodies are heat treated under a reducing atmosphere at 1600° C. or higher and joined and integrated, it is possible to easily obtain a susceptor with a built-in electrode which has excellent corrosion resistance and plasma resistance, and in which leakage current does not occur under high temperatures.

Furthermore, because the mounting plate and the support plate can be a simple plate shape, the use of complex shapes for these plates is not required, and the susceptor with a built-in electrode can therefore be manufactured economically, and with a high yield rate.

Moreover, the susceptor with a built-in electrode is manufactured using the mounting plate and the support plate which are already in the form of a sintered body, and consequently it is possible to easily manufacture a susceptor with a built-in electrode which has high dimensional accuracy.

In addition, if a structure is employed in which a fastening hole is formed in the support plate, a power supply terminal is fitted into this fastening hole, and an internal electrode is formed on and wired to an upper surface of an edge of this power supply terminal, the power supply terminal and the internal electrode contact well, and a reliable electrical connection can thus be established.

The manufacturing method for a susceptor with a built-in electrode according to an eighth aspect comprises the steps of: manufacturing a mounting plate green body on which a plate specimen is mounted and a support plate green body which supports the mounting plate, from a slurry containing an aluminum nitride base powder; then forming a layer of a conductive material containing an aluminum nitride and tungsten composite material or an aluminum nitride and molybdenum composite material on the support plate green body; then superposing the support plate green body and the mounting plate green body via the layer of conductive material, and calcining the resulting product under a reducing atmosphere at 1600° C. or higher, and forming the internal electrode which is obtained by calcination of the layer of conductive material between the mounting plate and the support plate, and joining and integrating these.

In this manufacturing method for a susceptor with a built-in electrode, because the mounting plate green body and the support plate green body are calcined under a reducing atmosphere at 1600° C. or higher and joined and integrated, it is possible to easily obtain a susceptor with a built-in electrode which has excellent corrosion resistance and plasma resistance and in which leakage current does not occur under high temperatures.

Furthermore, because the mounting plate and the support plate can be a simple plate shape, the use of complex shapes for these plates is not required, and the susceptor with a built-in electrode can be manufactured economically, and with a high yield rate.

Moreover, because the susceptor with a built-in electrode can be manufactured in one heat treatment (calcination) cycle, manufacturing costs can be reduced.

In addition, if a structure is employed in which a fastening hole is formed in the support plate green body, and a power supply terminal is fitted into this fastening hole, and a conductive material layer constituting the internal electrode is formed on an upper surface of an edge of this power supply terminal, the power supply terminal and the internal electrode contact well, and a reliable electrical connection can thus be established.

Furthermore, in the manufacturing method for a susceptor with a built-in electrode according to either one of the seventh and eighth aspects, an insulation material layer may be formed from a material which shares at least the same main component as the materials used to form the mounting plate and the support plate, in those regions on the support plate excluding the conductive material layer.

By employing such a structure, the join of the mounting plate and the support plate is further strengthened, and corrosion resistance and plasma resistance are also improved.

DETAILED DESCRIPTION OF THE INVENTION

An embodiment of a susceptor with a built-in internal electrode and a manufacturing method therefor according to the present invention is described below.

In order to better understand the gist of the invention, the present embodiment is described specifically, but the present invention is not limited to this unless particularly specified.

Susceptor with a Built-In Electrode

Figure 1:
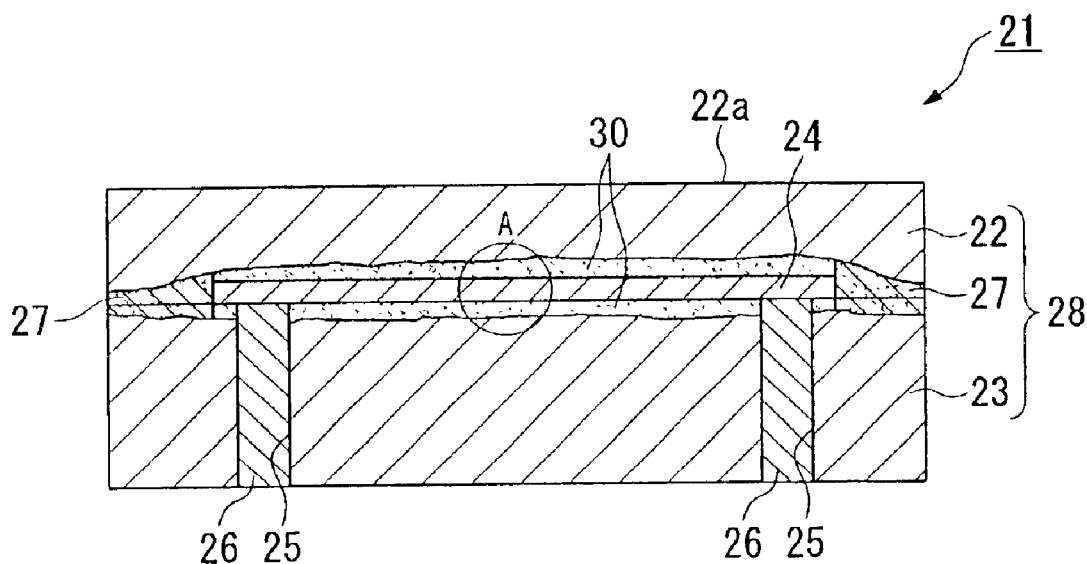
FIG. 1 is a cross-sectional view showing a susceptor with a built-in electrode according to an embodiment of the present invention.
Figure 2:
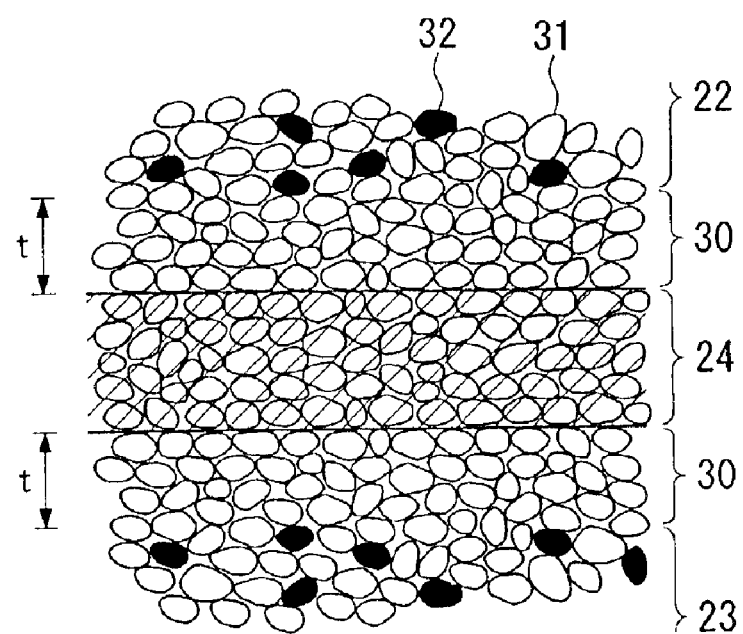
FIG. 2 is a partial enlarged cross-sectional view of the region A in FIG. 1.

FIG. 1 is a cross-sectional view showing an embodiment of the susceptor with a built-in electrode according to an embodiment of the present invention, and FIG. 2 is a partial enlarged cross-sectional view of the region A in FIG. 1.

This susceptor with a built-in electrode 21 comprises: a mounting plate 22, the upper surface (the principal plane) of which serves as a mounting surface 22a upon which the plate specimen is mounted; a support plate 23 which is integrated with this mounting plate 22; an internal electrode 24 which is formed between the mounting plate 22 and the support plate 23; and power supply terminals 26 which are provided firmly within fastening holes 25 which pass through the support plate 23 in the thickness direction, and with one end electrically connected to the internal electrode 24 and the other end exposed from the support plate 23.

The mounting surface 22a of the mounting plate 22 is polished to obtain a flatness of preferably 10 $\mu$m or less.

The mounting plate 22 and the support plate 23 are joined and integrated by an insulating layer 27 formed from an insulating material which is of the same composition or at least has the same principal ingredient as these, so that the mounting plate 22, the support plate 23 and the insulating layer 27 form a susceptor substrate 28.

The mounting plate 22 and the support plate 23 have the same shape for their superposed surfaces, and are formed from an aluminum nitride based sintered body.

Provided that the aluminum nitride (AlN) content is 50 wt % or greater, there are no particular restrictions on this aluminum nitride based sintered body. For example a composite system sintered body containing less than 50 wt % of silicon carbide (SiC), yttrium oxide ($Y_2O_3$), calcium oxide (CaO) or magnesium oxide (MgO) or the like may be used.

The insulating layer 27 is provided in order to join the interfaces of the mounting plate 22 and the support plate 23, or in other words the boundary regions excluding those regions in which the internal electrode 24 is formed, and is formed from a powdered insulating material which is the same as or has the same principal ingredient as the mounting plate 22 and the support plate 23. Here, "a material which has the same principal ingredient" refers to a material which contains less than 50 wt % of a material other than aluminum nitride constituting the mounting plate 22 and the support plate 23, such as silicon carbide (SiC), yttrium oxide ($Y_2O_3$), calcium oxide (CaO) or magnesium oxide (MgO).

The internal electrode 24 can be used as an electrostatic chuck electrode for generating an electric charge to secure the plate specimen by electrostatic attraction, a heater electrode for heating the plate specimen by current heating, a plasma generation electrode for performing plasma processing by conducting high frequency power and generating plasma, and the like, and the shape and size thereof are adjusted appropriately according to its use.

This internal electrode 24 is formed from a conductive aluminum nitride and tungsten composite sintered body or a conductive aluminum nitride and molybdenum composite sintered body.

Here, an aluminum tungsten composite sintered body refers to a composite sintered body formed from aluminum nitride and tungsten, containing no less than 10 wt % of aluminum nitride. Furthermore, an aluminum nitride and molybdenum composite sintered body refers to a composite sintered body formed from aluminum nitride and molybdenum, containing no less than 20 wt % of aluminum nitride.

Moreover, a special heat treatment or reduction process as described below in "a manufacturing method for a susceptor with a built-in electrode" is performed on the aluminum nitride based sintered body, and as shown in FIG. 1 and FIG. 2, both sides of the internal electrode 24 are coated with a nonconductive material 30.

Because both sides of the internal electrode 24 are coated with the nonconductive material 30 to a thickness t of approximately 10 $\mu$m to 30 $\mu$m, the occurrence of leakage current under high temperatures, for example under high temperatures exceeding 300° C., is effectively prevented.

As shown in FIG. 2, this nonconductive material 30 comprises pure aluminum nitride (AlN) particles 31 and does not contain sintering additives 32 such as yttria ($Y_2O_3$), calcia (CaO), magnesia (MgO) or titania ($TiO_2$).

Here, the aluminum nitride based sintered bodies which form the mounting plate 22 and the support plate 23 contain the sintering additives 32 such as yttrium oxide (Yttria: $Y_2O_3$), calcium oxide (calcia: CaO), magnesium oxide (Magnesia: MgO), or titanium oxide (titania: $TiO_2$) in addition to the aluminum nitride (AlN) particles 31. However, by performing the special heat treatment or reduction process mentioned above, the sintering additives 32 in the aluminum nitride based sintered bodies which form the mounting plate 22 and the support plate 23 diffuse towards the vicinity of the surface of the aluminum nitride and tungsten composite sintered body or the aluminum nitride and molybdenum composite sintered body which forms the internal electrode 24, and are finally eliminated from the sintered body, resulting in pure aluminum nitride (AlN) particles which do not contain the sintering additives 32.

Generally, impure elements which form within the aluminum nitride particles, and the presence of a grain boundary phase (Y—Al—O system complex oxides) caused by the sintering additives, is given as the reason for the reduction in the resistance of an aluminum nitride based sintered body to which sintering additives are added.

However, because the nonconductive material 30 described above comprises pure aluminum nitride (AlN) particles 31 and does not contain sintering additives 32, a reduction in resistance caused by the sintering additives 32 does not occur. Furthermore, since impure oxygen within the pure aluminum nitride (AlN) particles 31 which form the nonconductive material 30 is trapped by the sintering additives 32 and eliminated from within the particles, it is possible to obtain a reduction in the impurity level of the aluminum nitride (AlN). As a result, a reduction in the resistance of the aluminum nitride (AlN) itself in the vicinity of the internal electrode 24 is prevented.

The power supply terminals 26 are provided to supply an electric current to the internal electrode 24, and the number, shape and size thereof is determined based on the shape of the internal electrode 24, and the form, that is, whether the electrode is an electrostatic chuck electrode, a heater electrode, a plasma generation electrode or the like.

These power supply terminals 26 are formed from either a conductive composite sintered body formed by pressure sintering the conductive ceramic powder which forms the internal electrode 24 described above, or a high melting point metal such as tungsten or molybdenum.

According to the susceptor with a built-in electrode of the present embodiment, because there is no danger of the internal electrode 24 being exposed to corrosive gas or plasma, the corrosion resistance and plasma resistance can be improved. Furthermore, because the internal electrode 24 is coated with the nonconductive material 30, the occurrence of leakage current under high temperatures can be prevented.

Method of Manufacturing a Susceptor with a Built-In Electrode

Next, a method of manufacturing a susceptor with a built-in electrode of the embodiment is described with reference to FIG. 3.

Here, the method of manufacturing a susceptor with a built-in electrode is separated into two methods; (1) a method in which cooling is performed from the heat treatment or calcination temperature, and (2) a method in which heat treatment or calcination is performed under a reducing atmosphere. Each method is described in detail below.

(1) A Method in Which Cooling is Performed from the Heat Treatment or Calcination Temperature.

First, the plate shape mounting plate 22 and support plate 23 comprising aluminum nitride based sintered bodies are manufactured.

Next, as shown in FIG. 3(*a*), fastening holes 25 for receiving and holding the power supply terminals 26 are formed in the support plate 23. There are no particular limitations on the method used to form these fastening holes 25, and they can be formed using, for example, drilling processing using a diamond drill, laser processing, electro-discharge machining processing, or ultrasonic machining processing. Moreover, the accuracy of this processing may be normal machining accuracy, giving a yield of around 100%.

The location and the number of these fastening holes 25 are determined according to the form and shape of the internal electrode 24.

Next, the power supply terminals 26 are manufactured to such a size and shape which can fit tightly within the fastening holes 25 in the support plate 23.

As an example of a manufacturing method for these power supply terminals 26, in a case where the power supply terminals 26 are conductive composite sintered bodies, there is a method in which conductive ceramics powder is formed into the desired shape and then undergoes pressure sintering. At this time, the conductive ceramics powder used in the power supply terminals 26 is preferably the same as that used in the internal electrode 24 formed inside the susceptor with a built-in electrode 21. Furthermore, in a case where the power supply terminals 26 are metal, the power supply terminals 26 are formed from a high melting point metal using a known metal processing method such as grinding or powder metallurgy.

Since these power supply terminals 26 are recalcined and set in a subsequent pressurized heat treatment, the processing accuracy thereof may have a clearance within the standard tolerance level of the Japan Industrial Standard (JIS).

Next, as shown in FIG. 3(*b*), the manufactured power supply terminals 26 are fitted into the fastening holes 25 in the support plate 23.

Here, an internal electrode forming coating agent formed from aluminum nitride powder and either tungsten powder or molybdenum powder dissolved in an organic solvent such as ethyl alcohol is manufactured beforehand, and this internal electrode forming coating agent is applied to a predetermined region on the surface of the support plate 23 where the power supply terminals 26 are fitted so as to contact the power supply terminals 26, and then dried, thereby obtaining a conductive material layer 41.

Because this internal electrode forming coating agent must be applied with an even thickness, it is desirable to use a coating method such as screen printing.

Furthermore, in those regions upon the support plate 23 other than the regions where the conductive material layer 41 is formed, an insulation material layer 42 containing a powdered material which has the same composition as or which shares a principal ingredient with the material which forms the mounting plate 22 and the support plate 23 is formed, in order to increase nonconductivity, corrosion resistance and plasma resistance.

As an example of a formation method for this insulation material layer 42, there is a method in which a coating agent consisting of aluminum nitride powder dissolved in an organic solvent such as ethyl alcohol is applied by screen printing to predetermined locations upon the support plate 23, and then dried.

Next, after superposing the mounting plate 22 on the support plate 23, upon which is formed the conductive material layer 41 and the insulation material layer 42, via this conductive material layer 41 and insulation material layer 42, the resulting product is heat treated under pressure. For the heat treatment conditions at this time, it is preferable that the atmosphere is a vacuum, or an inert gas atmosphere of Ar, He, $N_2$ or the like. The pressure applied in this case is desirably 5 MPa to 10 Mpa. Furthermore, the heat treatment temperature is above 1600° C., and preferably between 1600° C. and 1900° C.

In order to diffuse the sintering additives in the aluminum nitride based sintered bodies which form the mounting plate 22 and the support plate 23 towards the vicinity of the surface of the internal electrode, and eliminate these sintering additives from the sintered body, cooling is either performed at a cooling rate of 5° per second from the heat treatment temperature to a temperature of 1500° C. or lower, or the heat treated susceptor is maintained for at least four hours and preferably for five hours within a temperature range of 1500° C. to 1800° C., and preferably at a temperature which is lower than the heat treatment temperature, within a temperature range of 1500° C. to 1800° C.

If the heat treatment conditions deviate from within the temperature range noted above, the generation of the non-conductive material which coats the internal electrode is insufficient. The atmosphere may be the same as the atmosphere used for the above-mentioned heat treatment.

Subsequently, after cooling to room temperature, the susceptor surface is polished to remove compounds containing the sintering additives which have seeped out.

Thus, as shown in FIG. 3(*c*), the conductive material layer 41 formed on the support plate 23 is calcined, thereby obtaining the internal electrode 24 comprising an aluminum nitride and tungsten composite sintered body or an aluminum nitride and molybdenum composite sintered body.

Furthermore, the support plate 23 and the mounting plate 22 are joined and integrated via the insulation material layer 42 by thermo-pressing only, without providing an organic or metal binder between the support plate 23 and the mounting plate 22. Moreover, the power supply terminals 26 are recalcined by thermo-pressing and fixed in the fastening holes 25 in the support plate 23. Also, the surface of the internal electrode 24 is coated with the nonconductive material 30 comprising pure aluminum nitride (AlN) particles 31 which do not contain sintering additives 32.

In this manufacturing method for a susceptor with a built-in electrode, a manufacturing method is described where the mounting plate 22 and the support plate 23 formed from an aluminum nitride based sintered body containing sintering additives are used and joined and integrated. However the present invention is not necessarily limited to this, and for example a susceptor could be manufactured by making plate shaped green bodies, which after calcining form the mounting plate and the support plate, from a slurry containing sintering additive powder, aluminum nitride base powder, a binder and an organic solvent, using a doctor blade method, and subsequently, performing sintering to obtain the mounting plate and the support plate, and joining and integrating these during the sintering process.

In this manufacturing method, as the power supply terminal, for example a product which is already sintered may be used, a green body which forms the power supply terminal after sintering may be used, or a product which is formed from a high melting point metal such as tungsten or molybdenum may be used. Other manufacturing conditions are the same as in the former manufacturing method.

(2) A Method in which Heat Treatment or Calcination is Performed under a Reducing Atmosphere.

In the same manner as in "(1) A method in which cooling is performed from the heat treatment or calcination temperature" above, the plate shaped mounting plate 22 and support plate 23 formed from aluminum nitride based sintered bodies are manufactured, fastening holes 25 for receiving and holding the power supply terminals 26 are formed in the support plate 23, and these power supply terminals 26 are fitted into these fastening holes 25. After this, the conductive material layer 41 and the insulation material layer 42 are formed on the support plate 23, and the mounting plate 22 and the support plate 23 are superposed via these layers 41 and 42.

Next, heat treatment is performed under pressure in a reducing atmosphere. For the heat treatment conditions at this time, the heat treatment temperature is 1600° C. or higher, and preferably between 1600° C. and 1900° C., and the pressure applied is desirably 5 MPa to 10 Mpa. If the heat treatment temperature is lower than 1600° C., there is insufficient reduction, and the generation of the nonconductive material which coats the internal electrode is insufficient.

A carbon atmosphere, a hydrocarbon atmosphere, a hydrogen gas atmosphere, a carbon monoxide gas atmosphere and the like can be given as examples of such a reducing atmosphere. The heat treatment time is set to at least four hours, and preferably five hours or more. Furthermore, when performing heat treatment under a reducing atmosphere, it is preferable that a treatment device formed from a carbon material is used, as this can enhance reduction.

Subsequently, after cooling to room temperature, the susceptor surface is polished to remove compounds containing the sintering additives which have seeped out.

The conductive material layer 41 formed on the support plate 23 is then calcined, thereby obtaining the internal electrode 24 formed from a conductive composite sintered body. Furthermore, the support plate 23 and the mounting plate 22 are joined and integrated via the insulation material layer 42 by thermo-pressing only, without providing an organic or metal binder between the support plate 23 and the mounting plate 22. Moreover, the power supply terminals 26 are recalcined by thermo-pressing and fixed in the fastening holes 25 in the support plate 23. Also, the surface of the internal electrode 24 is coated with the nonconductive material 30.

In this manufacturing method for a susceptor with a built-in electrode, a manufacturing method is described where the mounting plate 22 and the support plate 23 formed from an aluminum nitride based sintered body containing sintering additives are used and joined and integrated under a reducing atmosphere. However, the present invention is not necessarily limited to this, and for example a susceptor could be manufactured by making plate shaped green bodies which after calcining form the mounting plate and the support plate, from a slurry containing sintering additive powder, aluminum nitride base powder, a binder and an organic solvent, using a doctor blade method, and subsequently, performing calcination to obtain the mounting plate 22 and the support plate 23, and joining and integrating these during the calcination process.

In this manufacturing method, as the power supply terminal 26, for example a product which is already sintered may be used, a green body which forms the power supply terminal 26 after sintering may be used, or a product which is formed from a high melting point metal such as tungsten or molybdenum may be used. Other manufacturing conditions are the same as in the former manufacturing method.

As described above, in the manufacturing method for a susceptor with a built-in electrode according to the present embodiment, an insulating layer 27 formed from an insulating material which is of the same composition as or at least has the same principal ingredient as the material of the mounting plate 22 and the support plate 23 is formed on the joining surfaces of the mounting plate 22 and the support plate 23, and the mounting plate 22 and the support plate 23 are joined and integrated by this insulating layer 27. Therefore there is no danger of corrosive gas or plasma or the like penetrating from the interface of the mounting plate 22 and the support plate 23 to inside the susceptor with a built-in electrode 21, and the internal electrode 24 is thus not exposed to these. Consequently, there is no danger of the interface of the mounting plate 22 and the support plate 23 being damaged.

Furthermore, there is no danger of abnormal electrical discharge or damage or the like occurring, and the corrosion resistance and plasma resistance of the susceptor with a built-in electrode 21 can be improved.

Moreover, because the internal electrode 24 is coated with the nonconductive material 30, leakage current under high temperatures is effectively prevented.

Furthermore, in this manufacturing method for a susceptor with a built-in electrode 21, the mounting plate 22 and the support plate 23 are joined and integrated well by the insulating layer 27. Therefore no special device for the shape of these plates such as in conventional methods is required, and these plates can be a simple plate shape. Consequently, the susceptor 21 can be manufactured economically and with a high yield rate.

EXAMPLES

The present invention is described in detail below through examples and comparative examples for a case in which the internal electrode 24 is an electrostatic chuck electrode.

Example 1

Manufacturing the Power Supply Terminal 62 parts by weight of aluminum nitride powder (average particle diameter 0.6 $\mu$m, made by Tokuyama Corp., containing 5 wt % of a sintering additive $Y_2O_3$), 158 parts by weight of tungsten powder (average particle diameter 0.5 $\mu$m, made by Allied Materials Ltd.), and 250 parts by weight of isopropyl alcohol were mixed together, and then evenly dispersed using a planetary ball mill, thereby obtaining a slurry.

Next, the alcohol portion of this slurry was removed by suction filtration, the slurry was dried, and an aluminum nitride and tungsten composite powder was obtained.

Figure 3A:
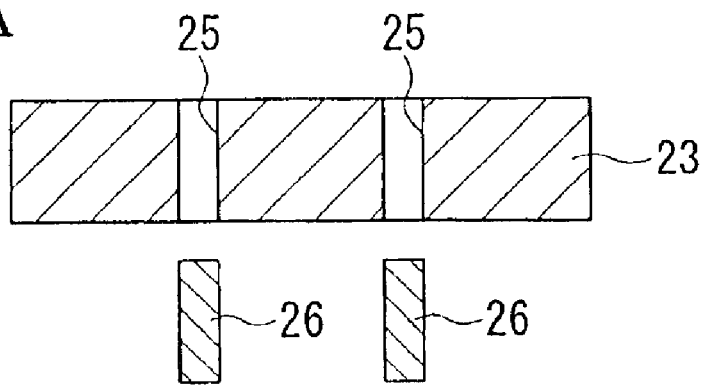
FIGS. 3A, 3B and 3C are process diagrams showing a manufacturing method for a susceptor with a built-in electrode according to an embodiment of the present invention.

Next, this aluminum nitride and tungsten composite powder was molded and calcined, thereby obtaining a conductive cylindrical aluminum nitride and tungsten composite sintered body with a diameter of 25 mm and length of 5 mm, to serve as the power supply terminal 26 shown in FIG. 3(a).

The calcination performed was pressurized calcination using a hot press, under calcination conditions of a calcination temperature of 1750° C. and pressure of 20 MPa. The relative density of the aluminum nitride and tungsten composite sintered body after sintering was over 98%.

Manufacturing the Support Plate

The above-mentioned aluminum nitride powder was molded and calcined, thereby obtaining a disk shape aluminum nitride base sintered body (support plate 23) with a diameter of 230 mm and a thickness of 5 mm. The calcination conditions were the same as the calcination conditions for the power supply terminal 26 above.

Next, fastening holes 25 for receiving and securing the power supply terminals 26 were formed in the aluminum nitride base sintered body by performing drilling processing using a diamond drill, thereby obtaining the support plate 23 formed from an aluminum nitride based sintered body as shown in FIG. 3(a).

Manufacturing the Mounting Plate

In the same manner as in the above described manufacturing method for the support plate 23 formed from the aluminum nitride base sintered body, a disk shape aluminum nitride base sintered body with a diameter of 230 mm and a thickness of 5 mm was obtained. Next, one primary surface (mounting surface for the plate specimen) of this aluminum nitride base sintered body was polished to obtain a flatness of 10 μm, thereby obtaining the mounting plate 22 formed from an aluminum nitride based sintered body.

Joining and Integration

Figure 3B:
Figure 3B:
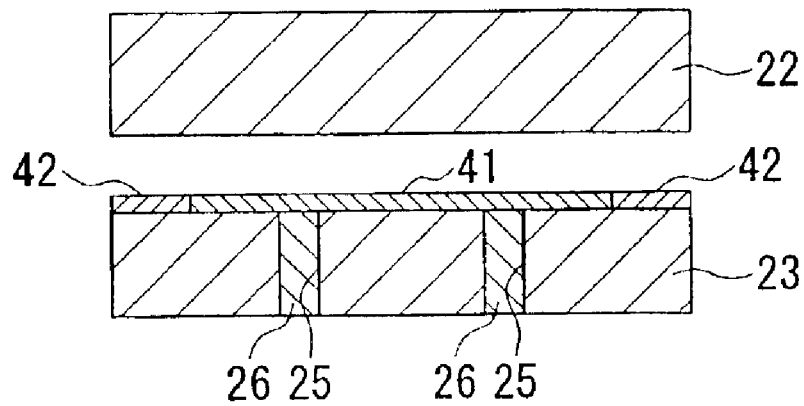

Next, as shown in FIG. 3(b), the power supply terminals 26 were pushed into the fastening holes 25 formed in the support plate 23, and thereby embedded and fixed.

Then, a coating agent comprising a conductive composite material (a composite material which is a mixture of 28 wt % of aluminum nitride powder and 72 wt % of tungsten powder), and ethyl alcohol and the like which subsequently forms the internal electrode 24 after the thermo-pressing process, was applied using a screen printing method to the support plate 23 into which the power supply terminals 26 had been embedded, and then dried, thereby forming the conductive material layer 41 for the disk shape internal electrode.

Next, in those regions on the support plate 23 other than the region where the internal electrode 24 is to be formed, a coating agent, 70 wt % of which is aluminum nitride powder and the remainder ethyl alcohol, was applied using a screen printing method and dried, thereby forming the insulation material layer 42.

Figure 3C:
Figure 3C:
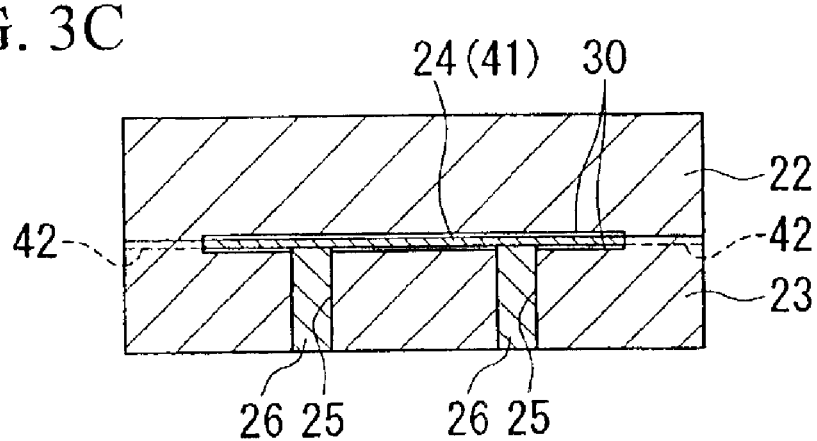

Then, as shown in FIG. 3(c), the support plate 23 and the mounting plate 22 were superposed so as to interpose the conductive material layer 41 (the printed surface) and the insulation material layer 42, and so that the polished surface of the mounting plate 22 was the upper surface, and were joined and integrated by performing heat treatment under a pressurized nitrogen atmosphere in a hot press. The heat treatment conditions at this time were a heat treatment temperature of 1700° C. and pressure of 7.5 MPa.

After cooling to 1500° C. at a cooling rate of 1° C. per minute, and after the temperature was brought to room temperature by radiational cooling, the surface of the susceptor was polished to remove compounds containing the sintering additives which had seeped out, thereby obtaining the susceptor with a built-in electrode according to example 1.

Example 2

The susceptor with a built-in electrode according to example 2 was obtained in the same manner as example 1, with the exception that the susceptor was maintained at a temperature of 1600° C. for five hours after heat treatment.

Example 3

In the same manner as in example 1, green bodies which following sintering form power supply terminals, a support plate, and a mounting plate, were manufactured using known technology. The green bodies which formed the power supply terminals were embedded into fastening holes formed in the green support plate.

Next, in the same manner as in example 1, the conductive material layer 41 and the insulation material layer 42 which become the internal electrode were formed, and then superposed and calcined under pressure in a hot press, thereby joining and integrating at the same time as obtaining a corresponding sintered body from each green body, and after cooling, the susceptor with a built-in electrode according to example 3 was obtained.

The pressurizing and heat treatment conditions in the hot press were a temperature of 1700° C. and pressure of 10 MPa. A primary surface of the mounting plate (the mounting surface for the plate specimen) was polished to obtain a flatness of 10 μm.

Example 4

The susceptor with a built-in electrode according to example 4 was obtained in the same manner as example 3, with the exception that the susceptor was maintained at a temperature of 1600° C. for five hours after calcination by hot press.

Example 5

In the same manner as in example 1, power supply terminals, a support plate and a mounting plate were manufactured. The power supply terminals were embedded into the fastening holes formed in the support plate.

Next, in the same manner as in example 1, the conductive material layer 41 and the insulation material layer 42 which become the internal electrode were formed, and then superposed, and heat treated under pressure in a carbon monoxide gas atmosphere for five hours, then joined and integrated, thereby obtaining the susceptor with a built-in electrode according to example 5. The pressurizing and heat treatment conditions were a temperature of 1700° C. and pressure of 7.5 MPa.

Example 6

In the same manner as in example 1, green bodies which following sintering form power supply terminals, a support plate, and a mounting plate were manufactured using known technology. The green bodies which formed the power supply terminals were embedded into fastening holes formed in the green support plate. Next, in the same manner as in example 1, the conductive material layer 41 and the insulation material layer 42 which become the internal electrode were formed, and then superposed. After this, in the same manner as in example 5, the susceptor with a built-in electrode according to example 6 was obtained.

Example 7

The susceptor with a built-in electrode according to example 7 was obtained in the same manner as example 1, with the exception that the conductive composite material which becomes the internal electrode 24 in the thermopressing process was changed to a conductive composite material containing 22 wt % of aluminum nitride powder and 78 wt % of molybdenum powder.

Example 8

The susceptor with a built-in electrode according to example 8 was obtained in the same manner as example 5, with the exception that the conductive composite material which becomes the internal electrode 24 in the thermopressing process was changed to the conductive composite material according to example 7.

Comparative Example 1

A susceptor with a built-in electrode according to comparative example 1 was obtained in the same manner as example 1, with the exception that the composite sintered body which was calcined and joined and integrated in the hot press underwent radiational cooling (at a cooling rate of 80° C. per minute).

The evaluations 1 to 3 below were performed for the susceptors with built-in electrodes according to examples 1 to 8 and comparative example 1 manufactured in the above manner.

Evaluation 1

A cross-section of the join in the susceptor with a built-in electrode of examples 1 to 8 and comparative example 1 was examined using a scanning electron microscope (SEM), and it was confirmed that the joining of the mounting plate 22, the support plate 23 and the power supply electrodes 26 was satisfactory.

Furthermore, after an experiment in which the susceptor with a built-in electrode 21 was exposed within a plasma of a mixed gas of $CF_4$ gas and $O_2$ gas for 15 hours, the surface properties of the susceptor with a built-in electrode 21 were visually observed, and no change in the surface properties was observed.

Moreover, the surface roughness of the mounting plate on which the plate specimen is mounted was measured, and the surface roughness Ra before the experiment above was 0.12 μm, and the surface roughness Ra after the experiment was 0.13 μm, which shows that the surface roughness had barely changed.

Furthermore, as a result of measuring the attractive force of this mounting plate, the attractive force before the experiment above was found to be 0.03 MPa, and the attractive force after the experiment was 0.03 MPa, which shows that there is also no variation in the attractive force.

From the above, it was determined that the corrosion resistance and plasma resistance were very good.

Evaluation 2

Figure 4:
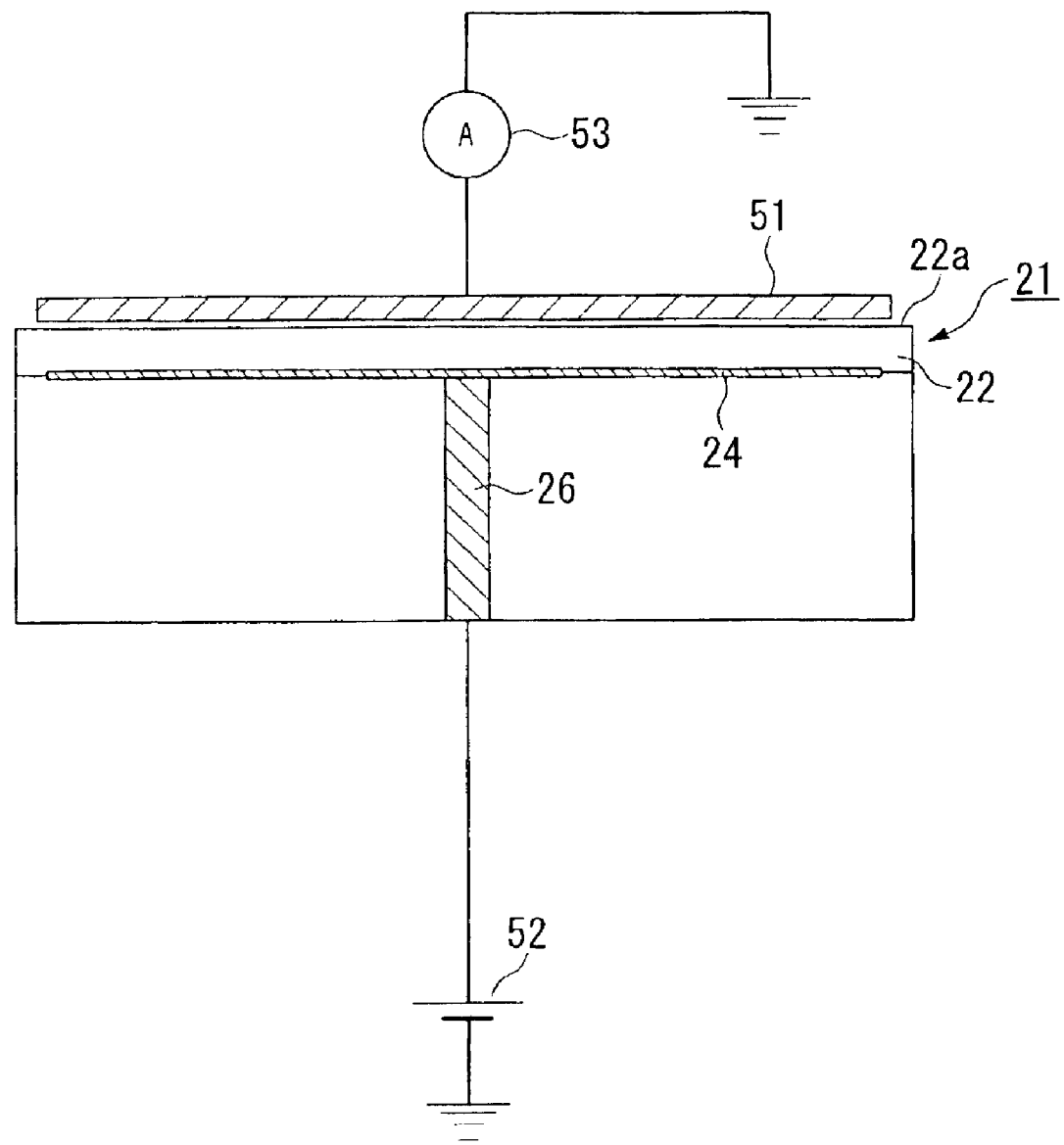
FIG. 4 is an explanatory diagram showing a measuring method for the volume resistivity value of a mounting plate of the susceptor with a built-in electrode.
Figure 5:
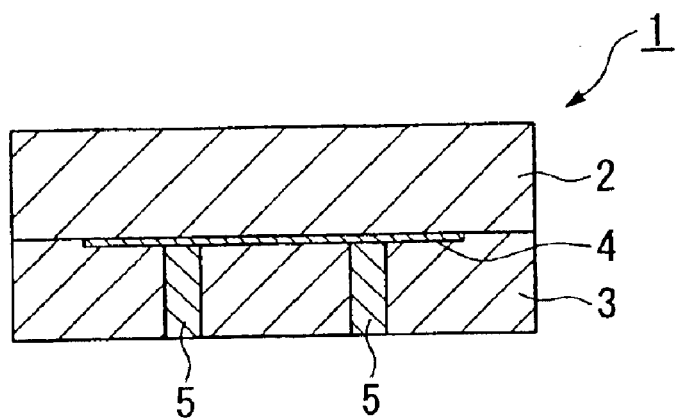
FIG. 5 is a cross-sectional view showing an example of a conventional susceptor with a built-in electrode.
Figure 6:
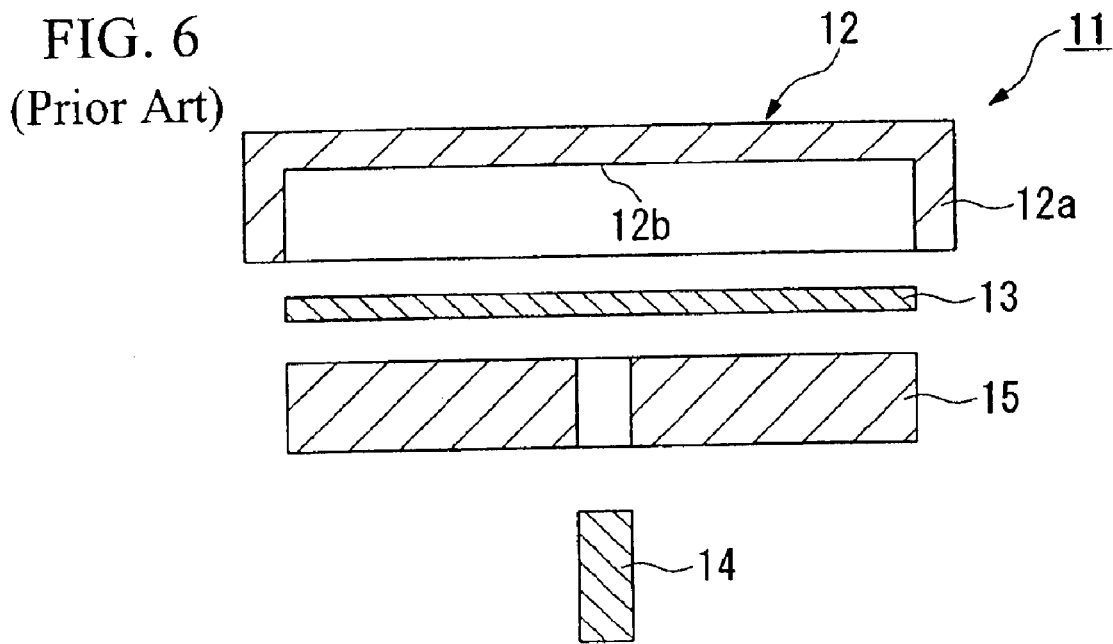
FIG. 6 is an exploded cross-sectional view showing each structural element of an improved conventional susceptor with a built-in electrode.
Figure 7:
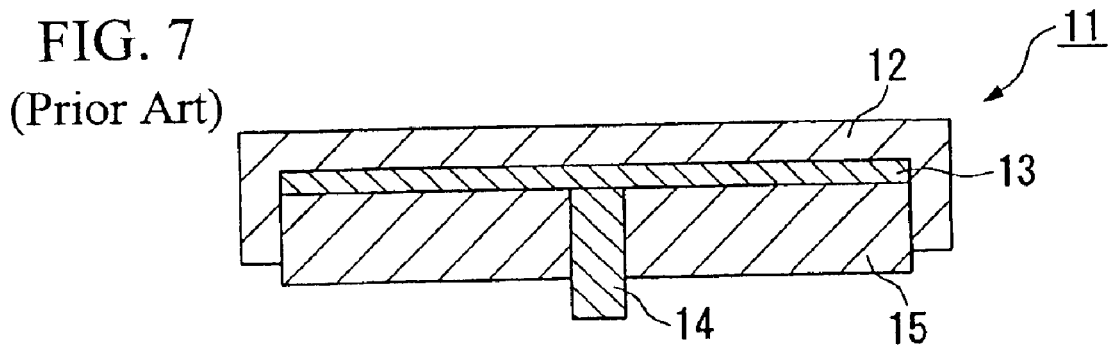
FIG. 7 is a cross-sectional view showing the entire shape of the improved conventional susceptor with a built-in electrode.

The volume resistivity value of the mounting plate of the susceptor with a built-in electrode according to examples 1 to 8 was measured using a measuring method shown in FIG. 4.

In this measuring method, an Si wafer 51 was mounted on the mounting surface 22a of the mounting plate 22 of the susceptor with a built-in electrode 21, which was maintained at a predetermined temperature, and 500 V of DC voltage was applied between this Si wafer 51 and the power supply terminal 26 using a DC power source 52. At this time, the leakage current flowing to the Si wafer 51 was measured using an ammeter 53, and a volume resistivity value R was calculated in accordance with the following equation (1) using this measured value.

$$R=(\pi r^2/d)\cdot(V/A) \quad (1)$$

where R: volume resistivity value (Ω·cm)
  r: radius of the electrode (cm)
  d: thickness of the mounting plate (the distance between the internal electrode and the Si wafer) (cm)
  V: applied voltage (V)
  A: leakage current (A)

The volume resistivity values of the mounting plates in each of the susceptors with built-in electrodes according to examples 1 to 8 obtained by the above measurement method was approximately $1.6\times10^{10}$ Ω·cm to $2.0\times10^{10}$ Ω·cm at 300° C., and $6.1\times10^{7}$ Ω·cm to $7.0\times10^{7}$ Ω·cm at 500° C. for all of the susceptors with built-in electrodes.

On the other hand, the volume resistivity value of the mounting plate of the susceptor with a built-in electrode according to comparative example 1 was $4.6\times10^{6}$ Ω·cm at 300° C.

These results show that sufficient nonconductivity under high temperatures is ensured in the susceptors with built-in electrodes according to examples 1 to 8 and leakage current does not occur, and that the nonconductivity under high temperature of the susceptor with a built-in electrode according to comparative example 1 is insufficient, and leakage current occurs.

Evaluation 3

After analyzing the distribution of sintering additives Y in the cross-sections of the susceptors with built-in electrodes according to examples 1 to 8 using an energy dispersive X-ray microanalyzer (EDXMA), the presence of sintering additives Y in the vicinity of the surface of the internal electrode (30 μm from the internal electrode) could not be confirmed.

On the other hand, after analyzing the distribution of sintering additives Y in the cross-section of the susceptor with a built-in electrode according to comparative example 1 using an EDXMA in the same manner, the presence of sintering additives Y was confirmed even in the vicinity of the surface of the internal electrode (30 μm from the internal electrode).

As described above, according to the susceptor with a built-in electrode of the present invention, an internal electrode formed from an aluminum nitride and tungsten composite sintered body or an aluminum nitride and molybdenum composite sintered body is built in to the susceptor substrate. Consequently there is no danger of this internal electrode being exposed to corrosive gas or plasma, resulting in a product with excellent corrosion resistance and plasma resistance. Furthermore, the internal electrode is coated with a nonconductive material, and hence the occurrence of leakage current under high temperatures can be prevented.

According to the manufacturing method for a susceptor with a built-in electrode of the present invention, the mounting plate and the support plate are joined and integrated, and either heat treatment or a reduction process is performed thereon. Consequently a susceptor with a built-in electrode which has excellent corrosion resistance and plasma resistance, and in which leakage current does not occur under high temperatures is easily obtained.

Furthermore, because the mounting plate and the support plate can be a simple plate shape, the use of complex shapes for these plates is not required, and the susceptor with a built-in electrode can be manufactured economically, and with a high yield rate.

What is claimed is:

1. A susceptor with a built-in electrode comprising:
a susceptor substrate formed from an aluminum nitride based sintered body which has one principal plane on which a plate specimen is mountable;
an internal electrode which is formed from an aluminum nitride and tungsten composite sintered body or an aluminum nitride and molybdenum composite sintered body and is built into said susceptor substrate; and
a power supply terminal which is provided on said susceptor substrate and supplies power to said internal electrode;
wherein, said internal electrode is coated with a nonconductive material which electrically insulates the internal electrodes from the one principal surface on which a plate specimen is mountable.

2. A susceptor with a built-in electrode according to claim 1, wherein said susceptor substrate comprises: a mounting plate formed from an aluminum nitride based sintered body which has a principal plane on which a plate specimen is mountable; and a support plate formed from an aluminum nitride based sintered body which supports said mounting plate,
and said internal electrode is interposed between and joined and integrated by said mounting plate and said support plate.

3. A susceptor with a built-in electrode according to claim 1, wherein said susceptor substrate comprises: a mounting plate formed from an aluminum nitride based sintered body which has a principal plane on which a plate specimen is mountable; and a support plate formed from an aluminum nitride based sintered body which supports said mounting plate,
and said internal electrode formed of an aluminum nitride and tungsten composite sintered body or an aluminum nitride and molybdenum composite sintered body is interposed between and joined and integrated by said mounting plate and said support plate.

\* \* \* \* \*